(12) United States Patent
Yan

(10) Patent No.: US 7,522,420 B2
(45) Date of Patent: Apr. 21, 2009

(54) CLIP MODULE AND HEAT-DISSIPATION DEVICE HAVING THE SAME

(75) Inventor: Kung-Jen Yan, Taipei (TW)

(73) Assignee: AMA Precision Inc., Taipei (TW)

( * ) Notice: Subject to any disclaimer, the term of this patent is extended or adjusted under 35 U.S.C. 154(b) by 0 days.

(21) Appl. No.: 11/950,714

(22) Filed: Dec. 5, 2007

(65) Prior Publication Data

US 2008/0137305 A1    Jun. 12, 2008

(30) Foreign Application Priority Data

Dec. 6, 2006    (TW) ............................... 95145371 A

(51) Int. Cl.
  *H05K 7/20* (2006.01)
  *F28F 7/00* (2006.01)
  *A44B 21/00* (2006.01)

(52) U.S. Cl. ...................... 361/704; 165/80.2; 165/80.3; 165/185; 257/719; 361/710; 361/719; 24/459; 248/505; 248/510

(58) Field of Classification Search .................. 24/459; 248/510; 257/718–719; 361/719
See application file for complete search history.

(56) References Cited

U.S. PATENT DOCUMENTS

| | | | |
|---|---|---|---|
| 6,318,452 B1 * | 11/2001 | Lee | 165/80.3 |
| 6,418,022 B1 * | 7/2002 | Chen | 361/704 |
| 6,421,242 B1 * | 7/2002 | Chen | 361/704 |
| 6,731,504 B1 | 5/2004 | Liu | |
| 7,061,764 B2 | 6/2006 | Lai et al. | |
| 7,292,442 B2 * | 11/2007 | Yu et al. | 361/704 |
| 7,391,615 B2 * | 6/2008 | Fu et al. | 361/704 |
| 7,397,663 B2 * | 7/2008 | Chen et al. | 361/704 |
| 7,430,121 B2 * | 9/2008 | Lu et al. | 361/719 |
| 7,467,443 B2 * | 12/2008 | Lin | 24/459 |

* cited by examiner

*Primary Examiner*—Gregory D Thompson
(74) *Attorney, Agent, or Firm*—J.C. Patents

(57) ABSTRACT

A clip module and heat-dissipation device having the same is disclosed. The heat-dissipation device includes a retention module (RM) disposed on a circuit board having a heat-source, a heat sink disposed on the heat-source, and a clip module. The clip module is across in the heat sink and is clipped with the RM. The clip module includes a body, a fastener, and a pressing structure. One end of the body is clipped with the RM, and the heat sink is pressed on the heat-source by the body. The fastener is disposed in the other end of the body. One end of the fastener is clip with the RM, and a guiding portion is disposed in the other end of the fastener. The guiding portion is slid in a guiding groove of the pressing structure, so that the pressing structure is connected with the fastener.

8 Claims, 8 Drawing Sheets

CLIP MODULE AND HEAT-DISSIPATION DEVICE HAVING THE SAME

CROSS-REFERENCE TO RELATED APPLICATION

This application claims the priority benefit of Taiwan application serial no. 95145371, filed on Dec. 6, 2006. All disclosure of the Taiwan application is incorporated herein by reference. The entirety of the above-mentioned patent application is hereby incorporated by reference herein and made a part of specification.

BACKGROUND OF THE INVENTION

1. Field of the Invention

The invention relates to a clip module and, more particularly, to a clip module and a heat-dissipation device having the same.

2. Description of the Related Art

Recently, with the rapidly development of technology, more transistors are included in various electronic components such as chipsets, so that the working temperature of these electronic component is increased. For example, the thermal output of the central process unit (CPU) is increased with its operation speed. For avoiding the computer bread down temporally or perpetually due to high temperature of the CPU, the computer must have enough cooling capability to guarantee the CPU working regularly. To achieve this objective, conventionally a heat-dissipation device is disposed on the CPU (or a heat source) for cooling.

FIG. 1A is a three-dimension schematic diagram showing a conventional heat-dissipation device disposed on a heat source. FIG. 1B is an exploded schematic diagram showing the heat-dissipation device according to FIG. 1A. Please refer to FIG. 1A and FIG. 1B, the conventional heat-dissipation device 100 is disposed in a computer for cooling of a heat source 10 such as a CPU. The heat-dissipation device 100 includes a retention module (RM) 110 surrounding the heat source 10, a heat sink 120, and a clip module 130. A heat sink 120 is disposed on the heat source 10 for cooling. The clip module 130 is across in the heat sink 120 and exerts a pressure on the heat sink 120 to connect with the heat source 10 tightly. Therefore, the heat form the heat source 10 can be conducted to the heat sink 120 efficiently, and then dissipated outside.

In conventional technology, the clip module 130 includes a body 132 crossed in the heat sink 120, a fastener 134, and a pressing structure 136. The heat sink 120 is pressed on the heat-source 10 by the body 132. One end of the body 132 is clipped with a tenon 112 of the RM 110. The fastener 134 is disposed on another end of the body 132 and clipped with another tenon 114 of the RM 110. In addition, the pressing structure 136 is pivoted on the fastener 134 by a bolt 138. The pressing structure 136 can be rotated to L1 (X axisaxis) along the pivot axis of the bolt 138 to press the body 132.

The pressing structure 136 of the conventional clip module 130 mentioned above is an eccentric mechanism, i.e. the rotation axis center of the pressing structure 136 is not at its center. Therefore, the rotation radius of the pressing structure 136 will be increased during rotation. More descriptions of the pressing structure 136 please refer to FIGS. 1C and 1D. FIG. 1C is a schematic diagram showing the clip module of FIG. 1A not clipped with the RM, and FIG. 1D is a schematic diagram showing the clip module of FIG. 1C clipped with the RM. In FIG. 1D, the rotation radius R2 of the pressing structure 136 is lager than the rotation radius R1 of the pressing structure 136 in FIG. 1C. The pressing structure 136 can press a connecting portion 132a of the body 132 in rotation, so that the connecting portion 132a moves down along the Z axis to press the heat sink 120 on the heat source 10.

Since the pressing structure 136 is an eccentric mechanism, in its rotation from the position of FIG. 1C to the position of FIG. 1D, its rotation radius rotated relating to the bolt 138 increases, so that the pressing stroke on the connecting portion 132a by the pressing structure 136 is increased. The conventional fastener 134 must have enough height to provide the pressing stroke on the connecting part 132a. However, the space around the heat sink is limited in the computer (the heat sink maybe surrounded by memories, other kinds of cards), the pressing unit 136 which pivoted on the fastener 134 may interfere the other electronic components around the heat sink in rotation, and consequently the heat sink 120 can not be disposed on the heat source 10 easily.

BRIEF DESCRIPTION OF THE INVENTION

An objective of the invention is to provide a clip module which can easily dispose a heat sink on a heat source and avoid interfering between the heat sink and surrounding electronic components.

Another objective of the invention is to provide a heat-dissipation device which can avoid the interfering between the clip module and the surrounding electronic components of the heat sink during assembling the heat sink on the heat source.

To achieve the above and other objectives, the invention provides a clip module working with a retention module (RM) for fixing a heat sink on a heat source. Wherein, the RM has a first clip portion and a second clip portion. The clip module of the invention includes a body, a fastener, and a pressing structure. The body has a pressing portion for pressing the heat sink on the heat source, a third clip portion, and a connecting portion. The third clip portion is on one end of the pressing portion and clipped with the first clip portion, and the connecting portion is on the other end of the pressing portion. The fastener is assembled with the connecting portion and has a guiding portion and a forth clip portion respectively disposed on each sides of the connecting portion. The forth clip portion is suitable for clipping with the second clip portion. The pressing structure includes a guiding groove and a pressing portion. The guiding portion can slide in the guiding groove for connecting the pressing structure and the fastener. The pressing portion can rotate relatively to the guiding portion, so that the guiding portion can slide in the guiding groove from a first predetermined position to a second predetermined position along a tracking line to force the body.

In one embodiment of the invention, the clip module further includes a fixing stand disposed between the connecting portion and the pressing structure. The fixing stand has a through hole and a stop groove. The fastener passes through the through hole and connects with the pressing structure through the guiding portion and guiding groove, and the pressing structure is supported by the stop groove to rotate relative to the guiding portion.

In one embodiment of the invention, when the guiding portion is at the first predetermined position, the minimum distance between the guiding portion and the outer margin of the pressing structure is a first distance. When the guiding portion is at the second predetermined position, the minimum distance between the guiding portion and the outer margin of the pressing structure is a second distance which is greater than the first distance.

In one embodiment of the invention, the guiding portion has a pivot.

The invention also provides a heat-dissipation device for heat dissipating to a heat source on a circuit board. The heat-dissipation device includes a retention module (RM), a heat sink disposed on the heat-source, and a clip module mentioned above. The RM disposed on the circuit board is around the heat-source, and has a first clip portion and a second clip portion. The clip module is across in the heat sink and is clipped with the RM.

In the heat-dissipation device of the invention, the clip module is across in the heat sink and is clipped with the RM, so that the heat sink can be disposed on the heat source firmly for cooling. The pressing structure of the clip module has a guiding groove. When the pressing portion is rotated by an external force, the guiding portion which can slide in the guiding groove will move from a first predetermined position to a second predetermined position. Therefore, the body of the pressing structure of the invention can exert a pressure on the heat sink during a short press stroke, and the heat sink can be disposed on the heat source firmly.

From above, the pressing structure of the invention can dispose the heat sink on the heat source firmly only in a short press stroke, the fastener of the invention is shorter and the pressing structure pivoted on the fastener does not easily interfere with the electronic components around the heat sink due to limited space in rotation. In another word, the clip module of the invention can fasten the heat sink on the heat source successfully.

These and other features, aspects, and advantages of the present invention will become better understood with regard to the following description, appended claims, and accompanying drawings.

DETAILED DESCRIPTION OF THE EMBODIMENTS

Figure 1A:
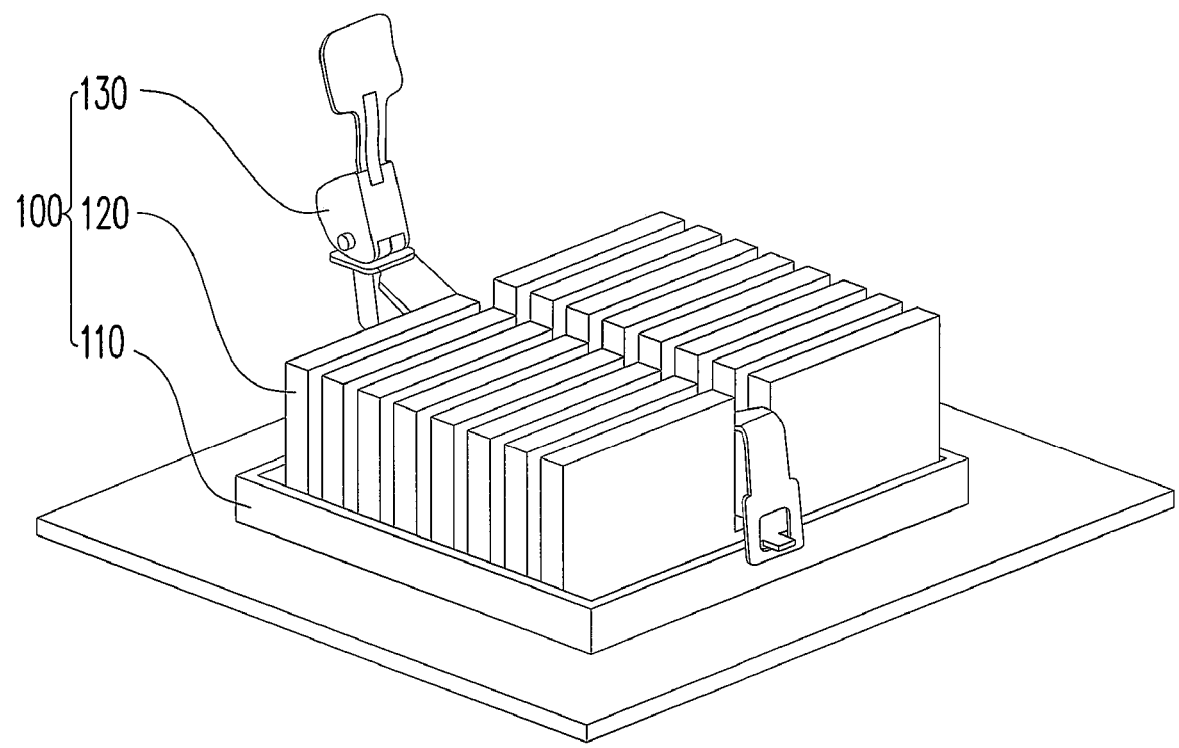
FIG. 1A is a three-dimension schematic diagram showing a conventional heat-dissipation device disposed on a heat source.
Figure 1B:
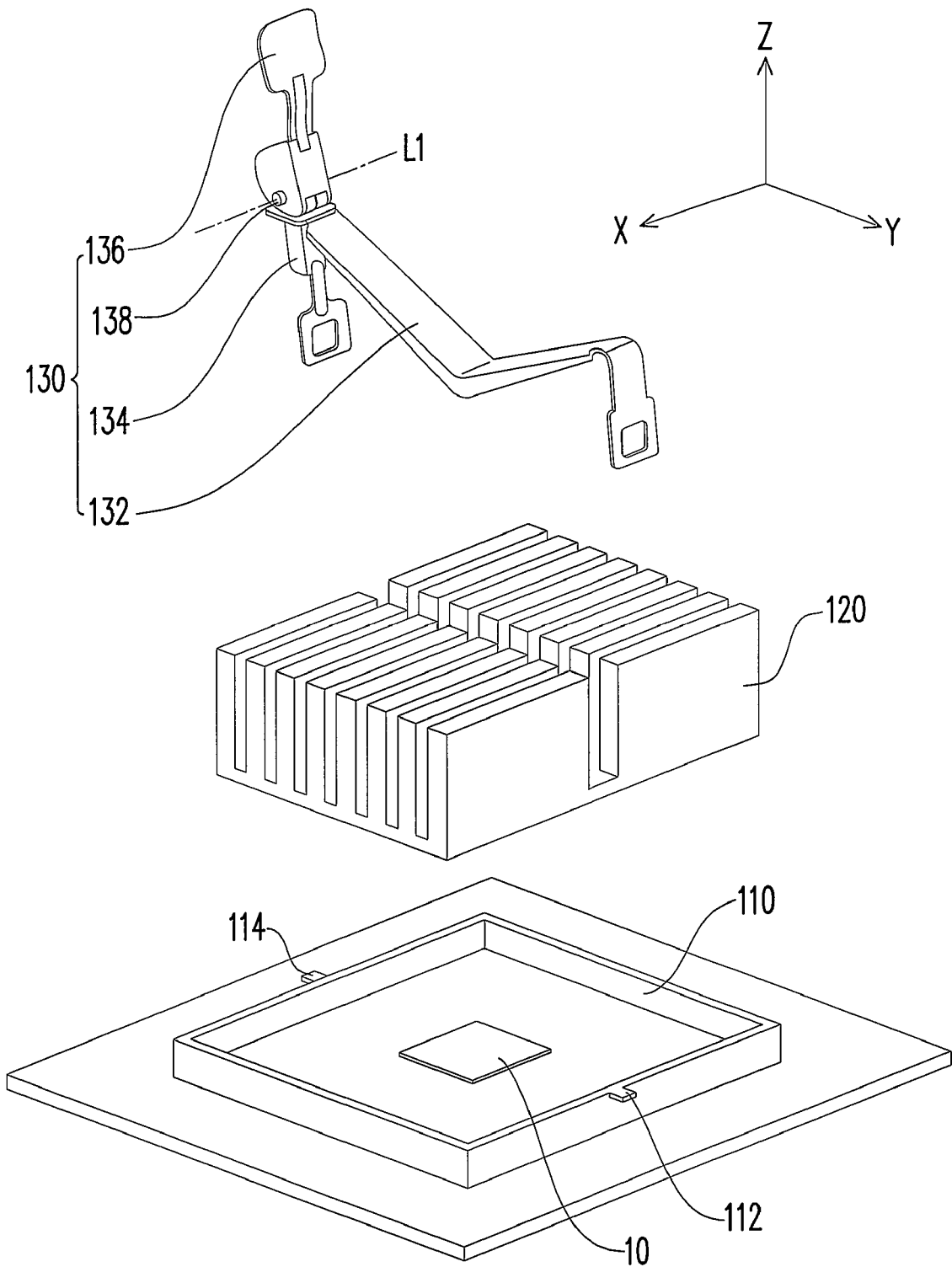
FIG. 1B is an exploded schematic diagram showing the heat-dissipation device according to FIG. 1A.
Figure 1C:
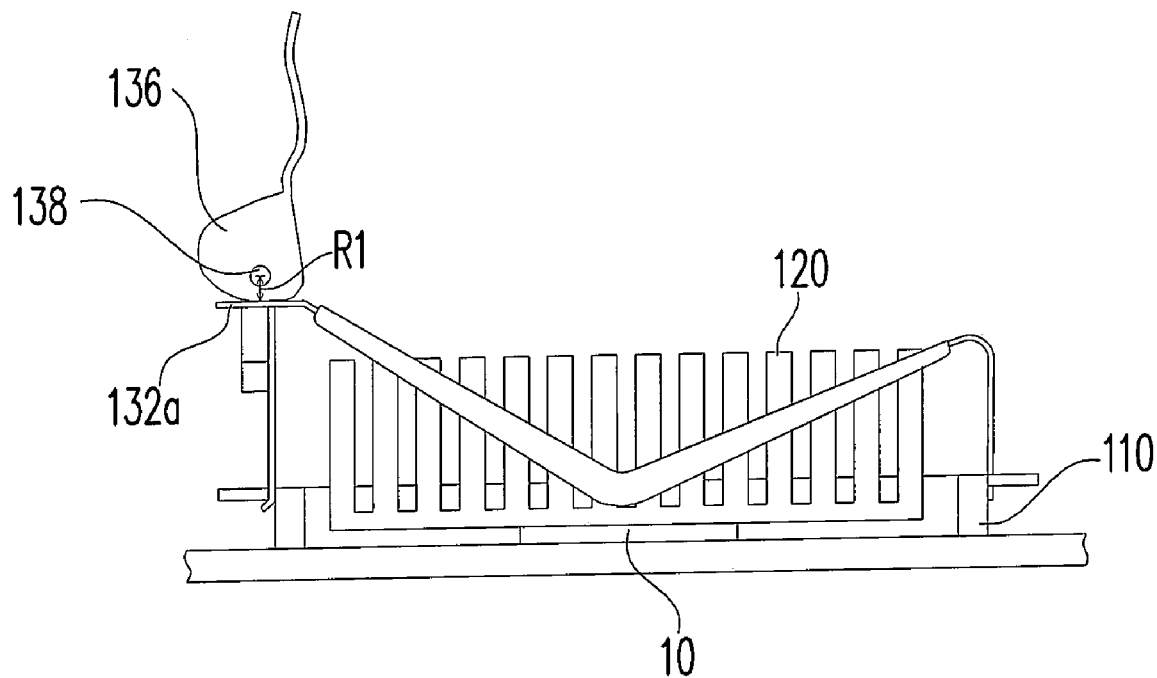
FIG. 1C is a schematic diagram showing a clip module of FIG. 1A not clipped with a retention module (RM).
Figure 1D:
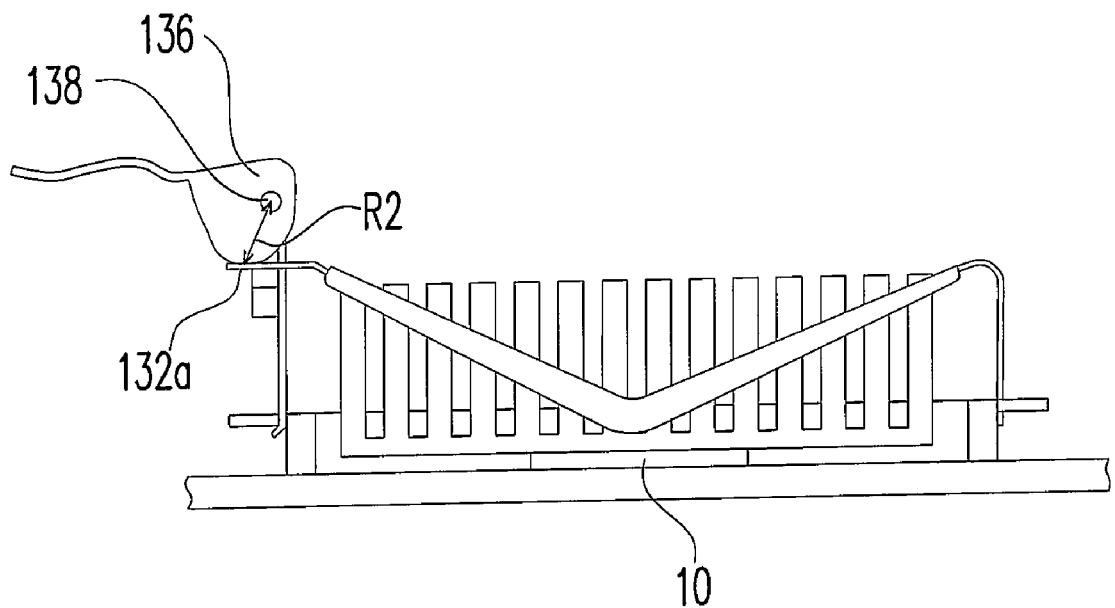
FIG. 1D is a schematic diagram showing the clip module of FIG. 1C clipped with the RM.
Figure 2A:
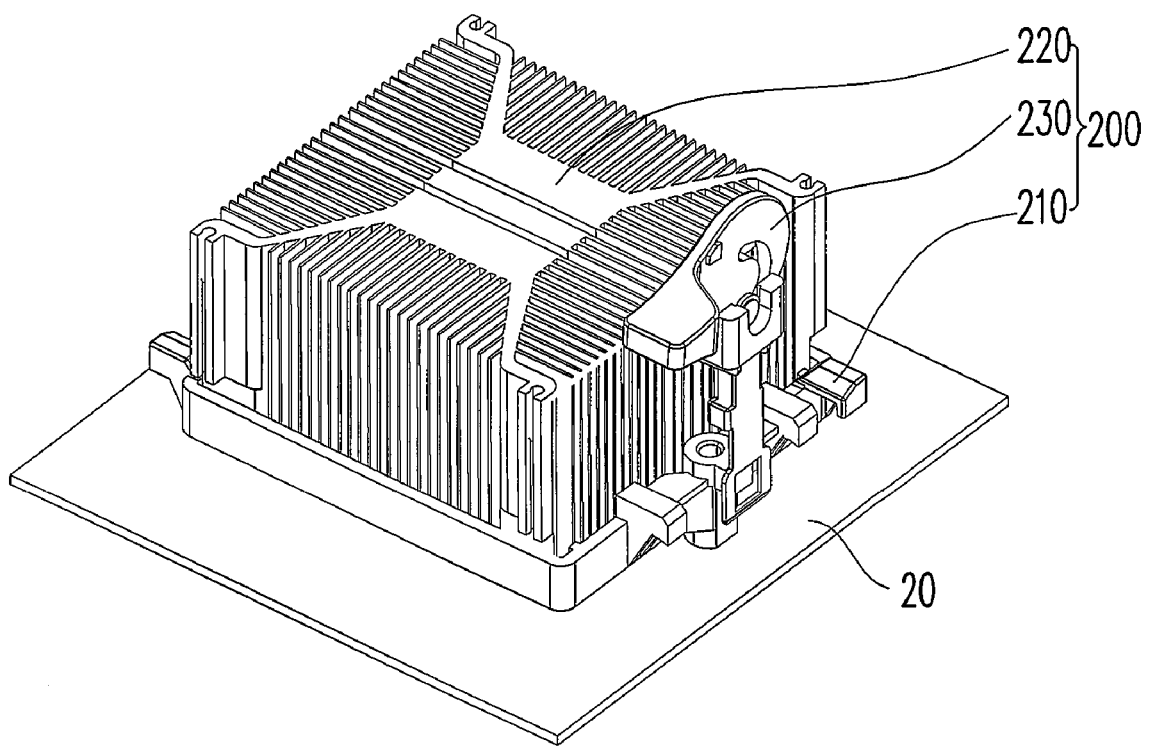
FIG. 2A is a three-dimensional schematic diagram showing a heat-dissipation device of the embodiment of the invention disposed on a heat source.
Figure 2B:
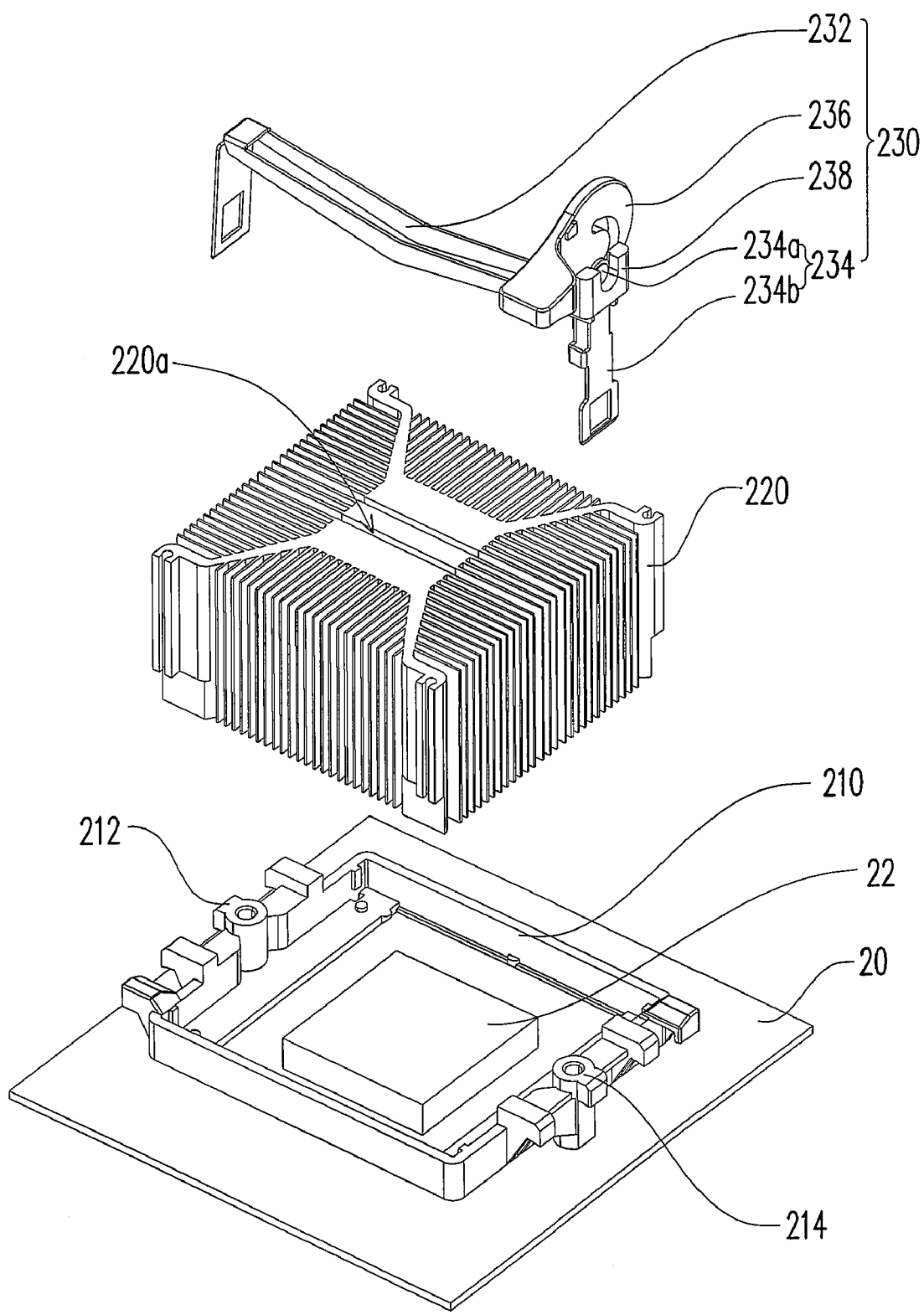
FIG. 2B is an exploded schematic diagram showing the heat-dissipation device and the heat source of FIG. 2A.

FIG. 2A is a three-dimensional schematic diagram showing a heat-dissipation device according to an embodiment of the invention disposed on a heat source. FIG. 2B is an exploded schematic diagram showing the heat-dissipation device and the heat source of FIG. 2A. Please refer to FIGS. 2A and 2B, the heat-dissipation device 200 is for dissipating heat generated by a heat source 22 on a circuit board 20 and includes a retention module (RM) 210, a heat sink 220 disposed on the heat source 22 , and a clip module 230.

In the embodiment of the invention, the RM 210 is disposed on the circuit board 20 and is around the heat-source 22, and has a first clip portion 212 and a second clip portion 214. The heat sink 220 can be an extrusion-type heat-sink or another suitable heat sink. The clip module 230 is across in the heat sink 220 and is clipped with the first clip portion 212 and the second clip portion 214 of the RM 210. More description of the clip module 230 shows below.

Figure 3:
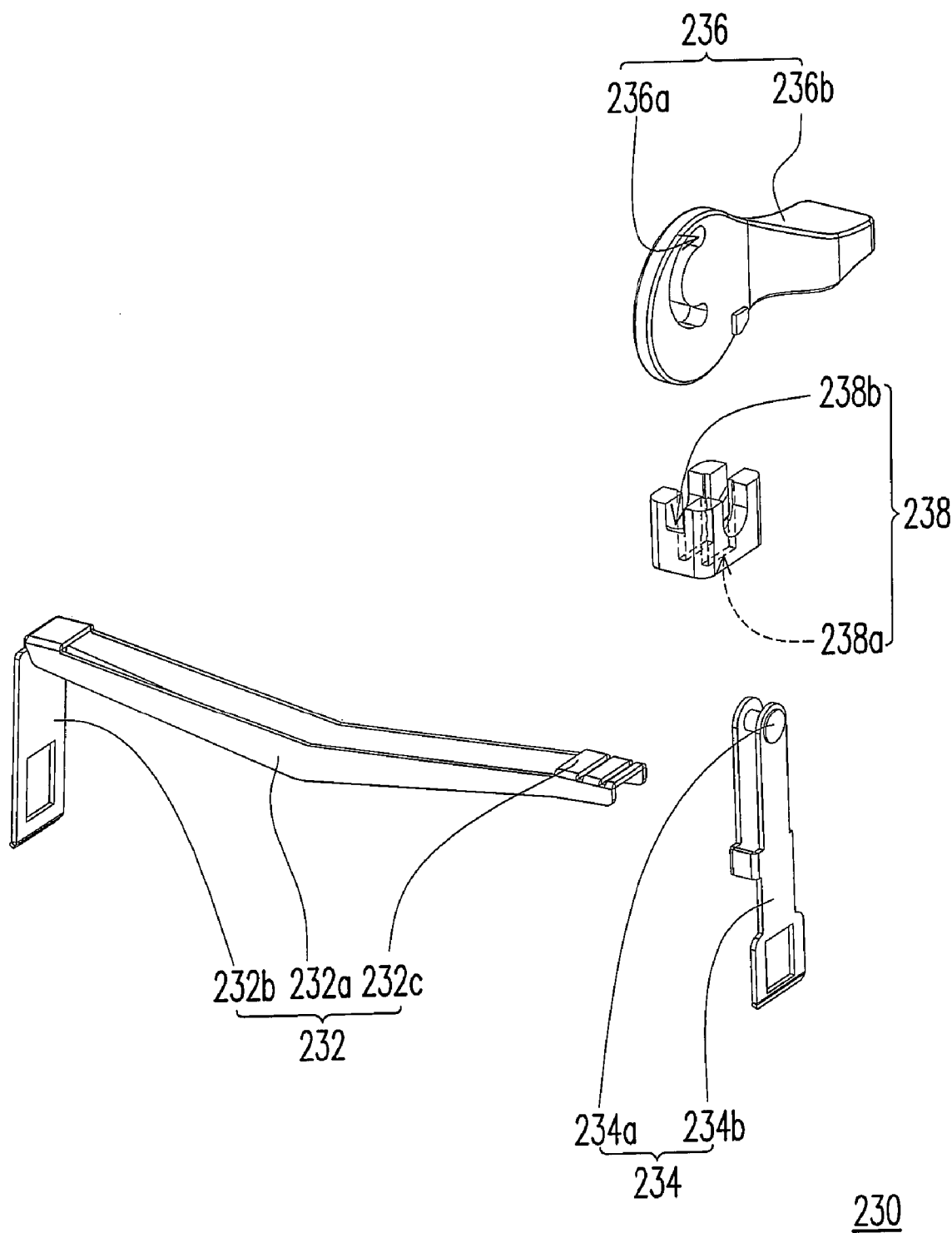
FIG. 3 is an exploded schematic diagram showing the clip module of FIG. 2B.

FIG. 3 is an exploded schematic diagram showing the clip module of FIG. 2B. The clip module 230 of the embodiment includes a body 232, a fastener 234, and a pressing structure 236. The body 232 has a pressing portion 232a, a third clip portion 232b on one end of the pressing portion 232a, and a connecting portion 232c on the other end of the pressing portion 232a. The heat sink 220 of the embodiment may have a groove 220a, and the pressing portion 232a of the body 232 passes through the groove 220a of fins 224 and presses on the heat sink 220. The third clip portion 232b is clipped with the first clip portion 212.

From above, the fastener 234 is disposed on the connecting portion 232c, wherein the fastener 234 has a guiding portion 234a with a pivot axis and a forth clip portion 234b. The guiding portion 234a is disposed on the connecting portion 232c. The forth clip portion 234b is used for clipping with the second clip portion 214. In the embodiment, each of the first clip portion 212 and the second clip portion 214 has a hook, and each of the third clip portion 232b and the forth clip portion 234b has a hole for clipping with the first clip portion 212 and the second clip portion 214 respectively. In other embodiments, the holes can be disposed in the first clip portion 212 and the second clip portion 214, and the hooks can be disposed on the third clip portion 232b and the forth clip portion 234b.

In addition, in the embodiment, the pressing structure 236 has a guiding groove 236a pivoted to the guiding portion 234a and a pressing section 236b for pressing by user. In the embodiment, the guiding portion 234a of the fastener 234 can slid in the guiding groove 236a, so that the pressing structure 236 can be connected with the fastener 234. Therefore, the body 232 can press the heat sink 220 on the heat source 22 firmly by rotating the pressing structure 236.

For avoiding the pressing structure 236 sways in rotation, the clip module 230 can further include a fixed stand 238 disposed between the connecting portion 232c and the pressing structure 236. The fixed stand 238 has a through hole 238a and a stop groove 238b. The fastener 234 passes through the through hole 238a and connects with the pressing structure 236 thought the guiding portion 234a and guiding groove 236a, and the pressing structure 236 is supported by the stop groove 238b to rotate relative to the guiding portion 234a, so that the pressing structure 236 can be rotated in the stop groove 238b firmly.

The above is focus on the elements of the clip module 230 and the relationships between the RM 210 and the heat sink 220. More description for how the clip module 230 clipped with the RM 210 to fasten the heat sink 220 on the heat source 22 is shown below.

Figure 4A:
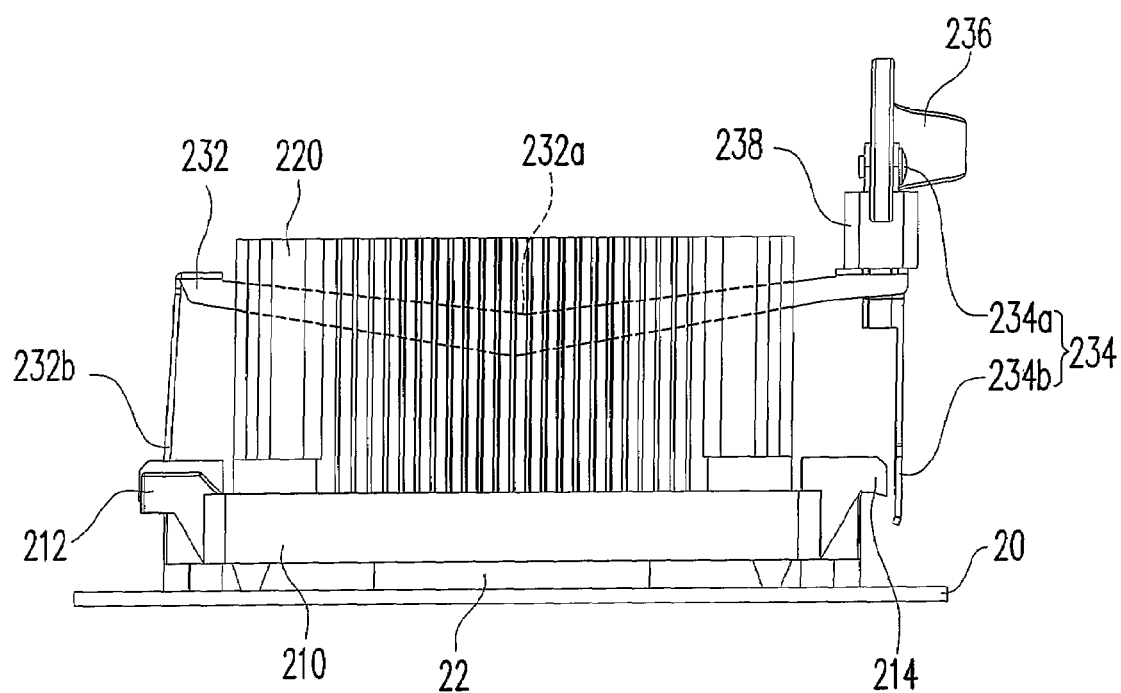
FIG. 4A is a front view of the heat-dissipation device disposed on the heat source in FIG. 2A.
Figure 4B:
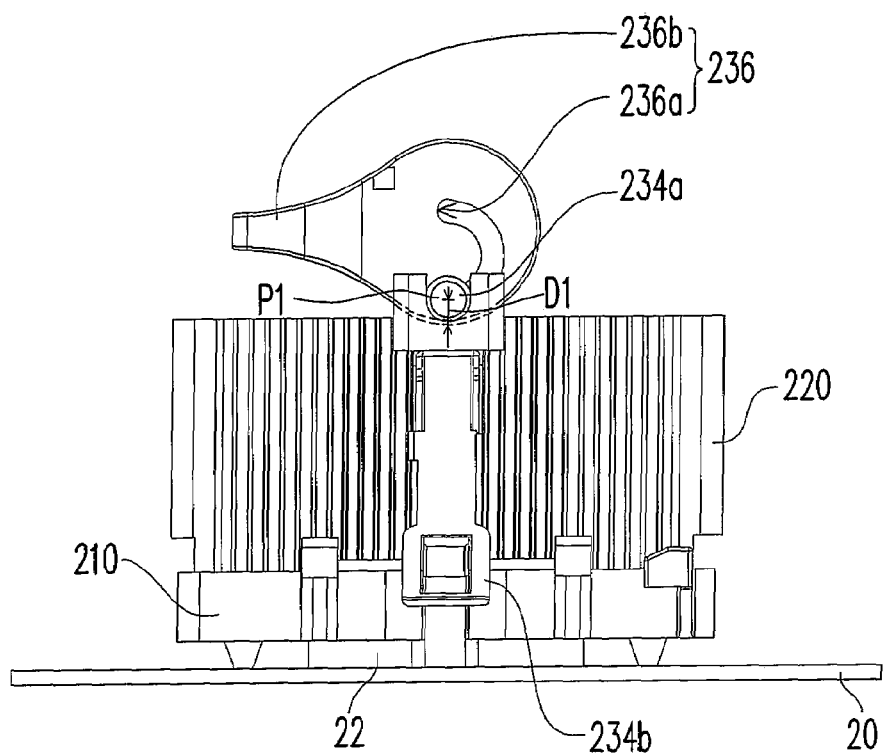
FIG. 4B is a side view of the heat-dissipation device of FIG. 4A.
Figure 5A:
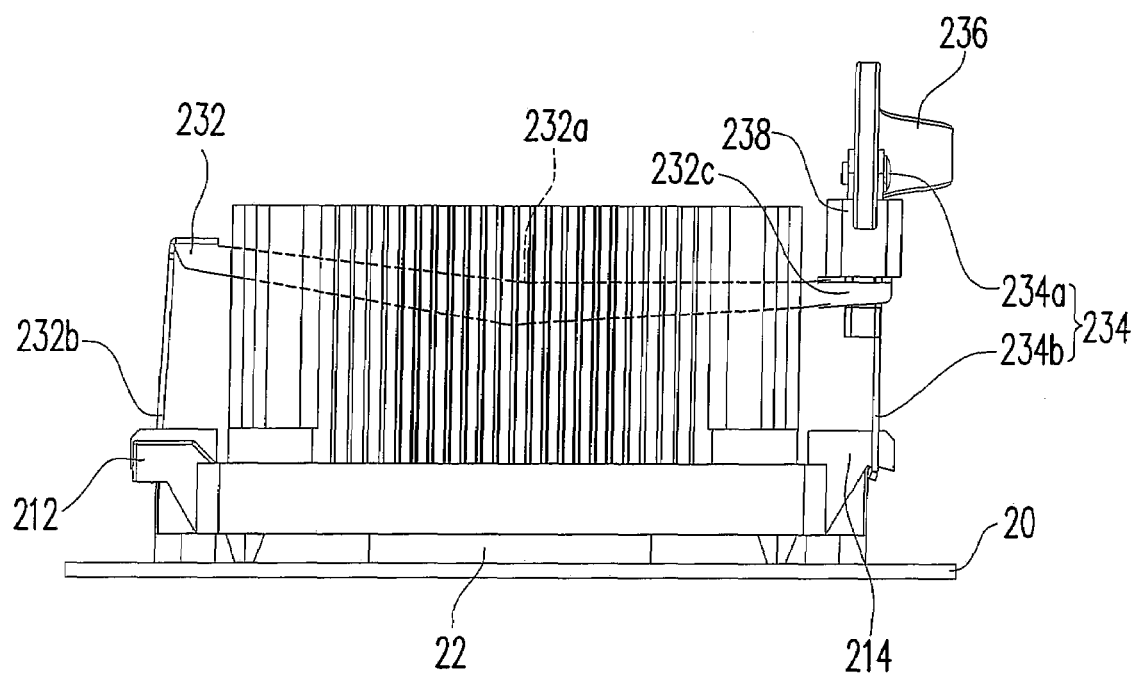
FIG. 5A is a front view of the clip module of FIG. 4 clipped with the RM.
Figure 5B:
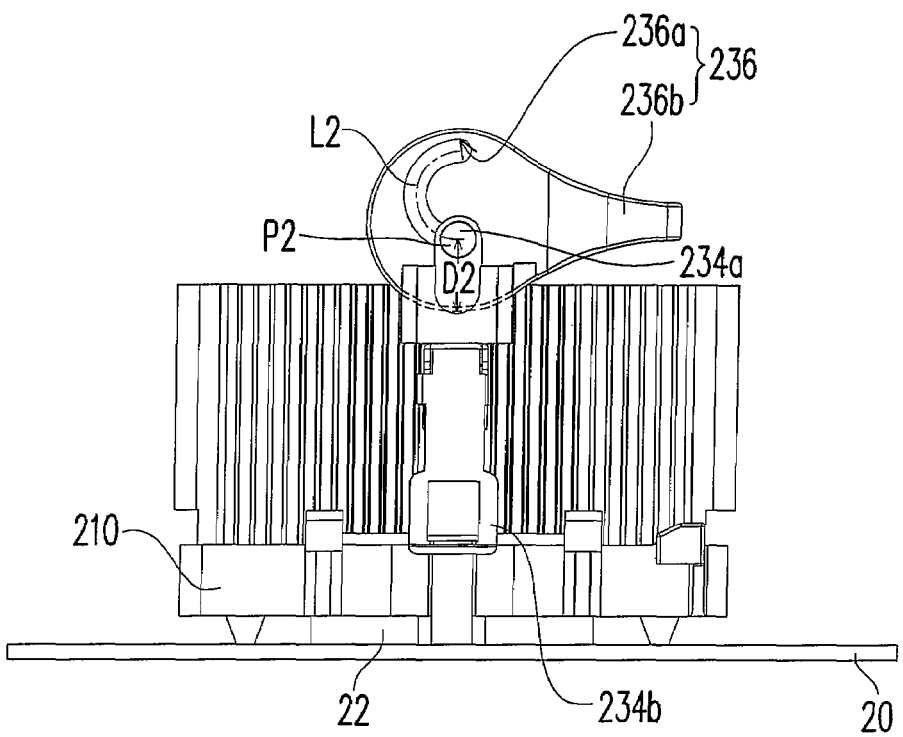
FIG. 5B is a side view of the heat-dissipation device of FIG. 5A.

FIG. 4A is a front view of the heat-dissipation device disposed on the heat source in FIG. 2A, and FIG. 4B is a side view of the heat-dissipation device of FIG. 4A. FIG. 5A is a front view of the clip module of FIG. 4 clipped with the RM, and FIG. 5B is a side view of the heat-dissipation device of FIG. 5A. Please refer to FIGS. 4A and 4B, when users want to press the heat sink 220 on the heat source 22, they can clip the third clip portion 232b of the body 232 with the first clip portion 212 of the RM 210 and then clip the forth clip portion 234b with the second clip portion 214 of the RM 210, so that the pressing portion 232a of the body 232 can be pressed on the heat sink 220. When the pressing structure 236 is not pressed by external force, the guiding portion 234a of the fastener 234 is in a first predetermined position P1 of the guiding groove 236a, and now the minimum distance between the guiding portion 234a and the outer margin of the pressing section 236b is a first distance D1.

Please refer to FIGS. 5A and 5B, when the pressing section 236b is moved by external force to rotate relative to the guiding portion 234a, the guiding portion 234a slid in the guiding groove 236a from the first predetermined position P1 to a second predetermined position P2 along a track line L2. Now the minimum distance between the guiding portion 234a in the second position P2 and the outer margin of the pressing section 236b is a second distance D2 which is longer than the first distance D1. Since the forth clip portion 234b of the fastener 234 is clipped with the second clip portion 214 of the RM 210, when the guiding portion 234a sliding from the first position P1 to the second position P2, the pressing structure 236 will press the connecting portion 232c down, i.e. the distance between the guiding portion 234a and the connecting portion 232c is increased, and then the body 232 can press the heat sink downward. In a preferable embodiment, the guiding groove 236a also can have a fixed pit at the end for fixing the guiding portion 234a in the second predetermined position P2 when the guiding portion 234a sliding to the second predetermined position P2. Therefore, the pressing structure 236 can press the body 232 efficiently to firmly clip the fastener 234 with the RM 210.

In the embodiment, the third clip portion 232b and the forth clip portion 234b are clipped with the first clip portion 212 and the second clip portion 214 respectively, and the body 232 of the clip module 230 presses the heat sink 220 down, so that the heat sink can be pressed on the heat source 22 firmly.

According to above, in a heat-dissipation device of the embodiment of the invention, a pressing structure of a clip module has a guiding groove. Therefore, when the pressing structure is rotated by an external force, a guiding portion disposed in the guiding groove slides from a first predetermined position to a second predetermined position (the distance between the guiding portion in the second predetermined position and the outer margin of the pressing structure is longer than the distance between the guiding portion in the first predetermined position and the outer margin of the pressing structure). Next, the pressing structure presses a connecting portion of a body down, so that the body can exert a pressure on a base to dispose the heat sink on the heat source firmly.

Compare to conventional technology, a guiding portion of the embodiment of the invention can slide along a guiding groove of a pressing structure during which rotation. Therefore, the pressing structure of the embodiment of the invention can exert a pressure on a body in a shorter pressing stroke, and then the body can press a heat sink on a heat source. In another word, a fastener of the embodiment of the invention is shorter in height, and a clip module is shorter than the conventional one as well. The pressing structure pivoted on the fastener can not easily interfere with other electronic component around the heat sink due to limited space in rotation, and the clip module can fix the heat sink on the heat source successfully.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A clip module working with a retention module (RM) to fasten a heat sink on a heat source, the retention module including a first clip portion and a second clip portion, the clip module comprising:

a body having a pressing portion, a third clip portion, and a connecting portion, the pressing portion being used for pressing the heat sink on the heat source, the third clip portion being on one end of the pressing portion and clipped with the first clip portion, and the connecting portion being on the other end of the pressing portion;

a fastener, disposed on the connecting portion, including a guiding portion and a forth clip portion, the guiding portion and the forth clip portion being disposed on each side of the connecting portion respectively, and the forth clip portion being clipped with the second clip portion; and a pressing structure having a guiding groove and a pressing section, the guiding portion being capable of sliding in the guiding groove to connect the pressing structure and the fastener, wherein the pressing structure rotates relative to the guiding portion, and the guiding portion slides in the guiding groove from a first predetermined position to a second predetermined position along a tracking line so that the pressing structure exerts a force on the body.

2. The clip module according to claim 1, further comprising a fixed stand disposed between the connecting portion and the pressing structure, the fixed stand having a through hole and a stop groove, the fastener passing through the through hole and connecting to the pressing structure through the guiding portion and guiding groove, the pressing structure being supported by the stop groove to rotate relative to the guiding portion.

3. The clip module according to the claim 1, wherein when the guiding portion is at the first predetermined position, a minimum distance between the guiding portion and an outer margin of the pressing structure is a first distance, and when the guiding portion is at the second predetermined position, a minimum distance between the guiding portion and the outer margin of the pressing structure is a second distance which is greater than the first distance.

4. The clip module according to claim 1, wherein the guiding portion has a pivot.

5. A heat-dissipation device dissipating heat from a heat source on a circuit board, comprising:

a retention module (RM), disposed on the circuit board, and including a first clip portion and a second clip portion;

a heat sink disposed on the heat source; and a clip module being across in the heat sink and clipped with the RM, the clip module comprising:

a body having a pressing portion, a third clip portion, and a connecting portion, the pressing portion being used for pressing the heat sink on the heat source, the third clip portion being on one end of the pressing portion and clipped with the first clip portion, and the connecting portion being on the other end of the pressing portion;

a fastener, disposed on the connecting portion, including a guiding portion and a forth clip portion, the guiding portion and the forth clip portion disposed on each side of the connecting portion respectively, and the forth clip portion being clipped with the second clip portion; and a pressing structure having a guiding groove and a pressing section, the guiding portion being capable of sliding in the guiding groove to connect the pressing structure and the fastener, wherein the pressing structure rotates relative to the guiding portion, and the guiding portion slides in the guiding groove from a first predetermined position to a second predetermined position along a tracking line so that the pressing structure exerts a force on the body.

6. The heat-dissipation device according to claim 5, wherein the clip module further comprises a fixed stand disposed between the connecting portion and the pressing structure, and the fixed stand has a through hole and a stop groove, the fastener passes through the through hole and connects to the pressing structure through the guiding portion and guiding groove, the pressing structure rotates relative to the guiding portion basing the stop groove.

7. The heat-dissipation device according to claim 5, wherein when the guiding portion is at the first predetermined position, a minimum distance between the guiding portion and an outer margin of the pressing structure is a first distance, and when the guiding portion is at the second predetermined position, a minimum distance between the guiding portion and the outer margin of the pressing structure is a second distance which is greater than the first distance.

8. The heat-dissipation device according to claim 5, wherein the guiding portion has a pivot.

* * * * *